(12) United States Patent
Phillips

(10) Patent No.: US 10,389,240 B2
(45) Date of Patent: *Aug. 20, 2019

(54) SWITCHING REGULATOR WITH MULTIPLE MOSFET TYPES

(71) Applicant: EMPOWER SEMICONDUCTOR, Oakland, CA (US)

(72) Inventor: Timothy Alan Phillips, Hope, RI (US)

(73) Assignee: EMPOWER SEMICONDUCTOR, Oakland, CA (US)

( * ) Notice: Subject to any disclaimer, the term of this patent is extended or adjusted under 35 U.S.C. 154(b) by 216 days.

This patent is subject to a terminal disclaimer.

(21) Appl. No.: 15/051,661

(22) Filed: Feb. 23, 2016

(65) Prior Publication Data

US 2017/0244321 A1 Aug. 24, 2017
US 2019/0068057 A9 Feb. 28, 2019

Related U.S. Application Data

(63) Continuation-in-part of application No. 15/051,419, filed on Feb. 23, 2016, now Pat. No. 9,843,258.

(60) Provisional application No. 62/119,630, filed on Feb. 23, 2015.

(51) Int. Cl.
*H02M 3/158* (2006.01)
*H03K 17/10* (2006.01)

(52) U.S. Cl.
CPC .......... *H02M 3/158* (2013.01); *H03K 17/102* (2013.01)

(58) Field of Classification Search
CPC .... H02M 3/156; H02M 3/158; H02M 3/1588; H02M 2003/1586; H02M 2001/0003; H02M 7/783; H02M 2001/0029
See application file for complete search history.

(56) References Cited

U.S. PATENT DOCUMENTS

| 7,834,579 B2 | 11/2010 | Nojima et al. | |
| 9,041,144 B2* | 5/2015 | Smith | H01L 27/092 257/500 |
| 9,806,611 B2* | 10/2017 | Wang | H02M 3/158 |
| 2011/0018511 A1* | 1/2011 | Carpenter | H02M 3/158 323/282 |

(Continued)

FOREIGN PATENT DOCUMENTS

WO WO2012074967 * 6/2012

OTHER PUBLICATIONS

Non-Final Office Action for U.S. Appl. No. 15/051,419, dated Jan. 26, 2017, 10 pages.

*Primary Examiner* — Adolf D Berhane
*Assistant Examiner* — Shahzeb K Ahmad
(74) *Attorney, Agent, or Firm* — Kilpatrick Townsend & Stockton LLP

(57) ABSTRACT

A buck voltage converter is disclosed. The buck voltage generator includes a controller configured to generate one or more pulse width modulation (PWM) signals, and a plurality of serially connected switches configured to receive the PWM signals and to generate an output voltage signal at an output terminal based on the received PWM signals. The output voltage signal has an average voltage corresponding with a duty cycle of the PWM signals, a first switch of the plurality of serially connected switches has a first breakdown voltage and a second switch of the plurality of serially connected switches has a second breakdown voltage, and the first breakdown voltage is less than the second breakdown voltage.

19 Claims, 8 Drawing Sheets

(56) References Cited

U.S. PATENT DOCUMENTS

| | | | |
|---|---|---|---|
| 2012/0326680 A1* | 12/2012 | Burns | H02M 3/1588 |
| | | | 323/224 |
| 2014/0306674 A1 | 10/2014 | Kondu et al. | |
| 2015/0280608 A1* | 10/2015 | Yoscovich | H02M 7/483 |
| | | | 363/131 |
| 2016/0248329 A1 | 8/2016 | Phillips et al. | |
| 2016/0285386 A1* | 9/2016 | Kataoka | H03K 17/122 |
| 2017/0149336 A1* | 5/2017 | Kidera | H02M 7/483 |

* cited by examiner

SWITCHING REGULATOR WITH MULTIPLE MOSFET TYPES

CROSS-REFERENCES TO RELATED APPLICATIONS

This application is a continuation in part of U.S. application Ser. No. 15/051,419, filed Feb. 23, 2016, titled "BUCK SWITCHING POWER STAE WITH MULTIPLE MOSFET TYPES," which claims the benefit of U.S. provisional application No. 62/119,630 filed Feb. 23, 2015, titled "HIGH VOLTAGE CMOS CASCODE BUCK POWER STAGE WITH MULTIPLE MOSFET TYPES," which are incorporated herein by reference.

FIELD OF THE INVENTION

The present application generally relates to semiconductor switching power converters, and more particularly to switching power converters having an output stage having more than two switches.

BACKGROUND OF THE INVENTION

This patent refers generally to switching voltage regulators. These regulators include, but are not limited to, isolate and non-isolated varieties such as buck, buck-boost, boost, flyback, etc. The invention will be described primarily with a single type of regulator, a buck regulator, for clarity. Typical switching regulator power converters, such as that illustrated in FIG. 1, utilize two switches 10 and 20 (e.g. MOSFETs or other transistors) to connect the converter's switch node (Vx) to either Vin or to ground. The switch node can present a pulse-width modulated square wave with its high-level substantially at the voltage of Vin and it's low-level substantially at the ground voltage of the input of a second order output filter 30. The output filter time-averages the switch node square wave to present a filtered output voltage that is proportional to the amount of time per cycle the switch node is connected to Vin.

Each switch in this typical configuration must be able to block the full input voltage (the difference between the voltage at Vin and ground) while off and while turning on. Therefore, each switch must have a minimum breakdown voltage equal to the input voltage plus a margin. In practice, it is typical to have the minimum breakdown voltage equal to two times the input voltage in discrete circuits where parasitic reactance in the interconnect causes voltage spiking that can be destructive.

Transistors, such as MOSFETs performance characteristics are dramatically impacted by their breakdown voltage. Two critical performance metrics in a MOSFET are its RDSon and gate charge (Qg). In general, MOSFET RDSon per unit area is proportional to the square of its breakdown voltage. In addition, required Qg to turn on the MOSFET is proportional to the area of gate and the thickness of the oxide underneath the gate. Higher voltage MOSFETs typically feature a thicker gate oxide which increases the Qg. This is compounded by the aforementioned fact that the gate area of a higher voltage MOSFET must be exponentially larger to achieve the same RDSon as a lower voltage version, thus exponentially increasing Qg as well.

Since losses in a MOSFET are proportional to both RD Son and Qg, reducing the blocking requirements on the MOSFETs in a voltage regulator is highly advantageous.

BRIEF SUMMARY OF THE INVENTION

One inventive aspect is a buck voltage converter. The buck voltage generator includes a controller configured to generate one or more pulse width modulation (PWM) signals, and a plurality of serially connected switches configured to receive the PWM signals and to generate an output voltage signal at an output terminal based on the received PWM signals. The output voltage signal has an average voltage corresponding with a duty cycle of the PWM signals, a first switch of the plurality of serially connected switches has a first breakdown voltage and a second switch of the plurality of serially connected switches has a second breakdown voltage, and the first breakdown voltage is less than the second breakdown voltage.

Another inventive aspect is a buck voltage converter. The buck voltage generator includes a plurality of serially connected switches configured to generate an output voltage signal at an output terminal, where the output voltage signal has an average voltage corresponding with a duty cycle of one or more PWM signals. A first switch of the plurality of serially connected switches has a first breakdown voltage and a second switch of the plurality of serially connected switches has a second breakdown voltage, and the first breakdown voltage is less than the second breakdown voltage.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein. For example, certain aspects and principles are discussed in the context of a buck power converter. However, as understood by those of ordinary skill in the art, the various aspects and principles may be applied in other types of switching converters, such as boost, buck-boost, and flyback regulators. In addition, in the embodiments discussed below, MOSFETs are used. However, in some embodiments other transistors or other switches are used.

Figure 2:
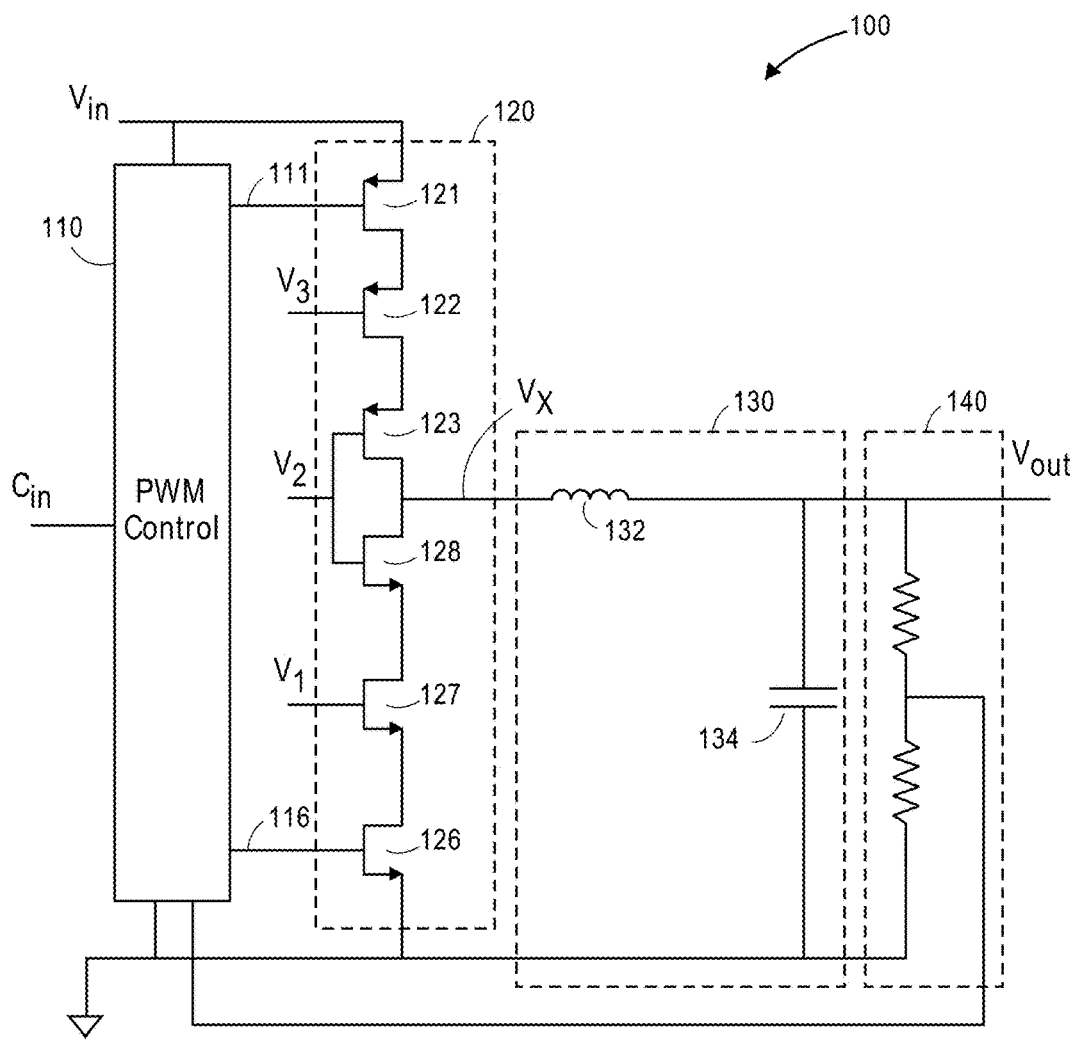
FIG. 2 is a schematic illustration of a buck power converter according to an embodiment.

FIG. 2 is a schematic illustration of a buck power converter according to an embodiment.

In order to avoid the aforementioned performance limitation of using power switches with breakdown voltages that are less than Vin, cascode output stages ("FET stacking") may be used. For example, as shown in FIG. 2, a series connection of MOSFETs can be used so that the resulting breakdown voltage of the series connected switches is equal to the sum of the breakdown voltages of the individual switches. Thus, one can utilize relatively low-voltage switches in a high-voltage application.

FIG. 2 illustrates buck converter 100, which includes pulse width modulation (PWM) controller 110, switch stack 120, output filter 130, and voltage feedback generator 140. Buck converter 100 is configured to generate a substantially DC voltage at output terminal Vout based on a received reference voltage at input terminal Cin and a received feedback voltage representing the output voltage Vout of the regulator.

In some embodiments, the PWM controller 110 and the switch stack 120 are integrated on a single integrated circuit semiconductor substrate, for example, comprising a semiconductor, such as single-crystalline silicon. In some embodiments, the PWM controller 110, the switch stack 120, and the filter 130 are integrated on a single integrated circuit semiconductor substrate, for example, comprising a semiconductor, such as single-crystalline silicon. In some embodiments, the PWM controller 110, the switch stack 120, the filter 130, and the voltage feedback generator 140 are integrated on a single integrated circuit semiconductor substrate, for example, comprising a semiconductor, such as single-crystalline silicon.

In some embodiments, the PWM controller 110 and the switch stack 120 are integrated on a single package substrate, for example, on a package substrate within an integrated circuit package having a semiconductor die attached thereto. In some embodiments, the PWM controller 110, the switch stack 120, and the filter 130 are integrated on a single package substrate, for example, on a package substrate within an integrated circuit package having a semiconductor die attached thereto. In some embodiments, the PWM controller 110, the switch stack 120, the filter 130, and the voltage feedback generator 140 are integrated on a single package substrate, for example, on a package substrate within an integrated circuit package having a semiconductor die attached thereto.

PWM controller 110 is configured to receive an input signal at Cin and generate PWM signals for switch stack 120 at nodes 111 and 116. In some embodiments, the PWM signals switch at a frequency greater than or equal to 1 MHz. In some embodiments, PWM controller 110 is replaced by another controller, such as a constant on-time controller, a hysteretic controller, or a resonant controller. Other controllers may be alternatively used. The PWM signals correspond with the type controller. In this example, the PWM controller generates control signals which are PWM signals. In other embodiments, the control signals may not be PWM, but other types of control signals which correspond with the type of controller used. For example, in some embodiments, PWM controller 110 is replaced by another controller, such as a constant on-time controller, a current mode controller, or a resonant controller. Other controllers may be alternatively used.

In some embodiments, circuitry between what might be considered the "controller" and switch stack 120 is used to condition, buffer, delay, or otherwise process signals from the "controller" for the switch stack 120 is, for the purposes of this application part of the controller.

Switch stack 120 is configured to receive the PWM signals at nodes 111 and 116, and to alternately and repeatedly drive output filter 130 with an output voltage signal at node Vx substantially equal to the voltage at input terminal Vin and ground. For example, during a first time period, switch stack 120 drives output filter 130 with an output signal voltage substantially equal to the voltage at Vin, and during a next, second time period, switch stack 120 drives output filter 130 with a output signal voltage substantially equal to the ground voltage. Switch stack 120 repeatedly alternates between driving the output filter 130 with the output signal voltage substantially equal to the voltage at input terminal Vin and substantially equal to ground, such that the proportion of time during which switch stack 120 drives the output filter with the output signal voltage substantially equal to the voltage at input terminal Vin is substantially equal to the ratio of the desired output voltage to the voltage at input terminal Vin. Accordingly, the output voltage signal may have an average voltage corresponding with a duty cycle or an inverse of the duty cycle of the PWM signals at nodes 111 and 116.

Output filter 130 receives the PWM voltage from switch stack 120, and generates a substantially DC voltage at output terminal Vout. In this embodiment, the output filter 130 comprises an inductor 132 and a capacitor 134. In alternative embodiments, alternative filter architectures are used.

In this embodiment, a voltage divided version of the DC voltage at output terminal Vout is fed back to PWM controller 110. In some embodiments, PWM controller 110 is configured to adjust the PWM signals at nodes 111 and 116 so as to generate a desired DC voltage at output terminal Vout. In some embodiments, the desired reverence DC voltage may be received at input Cin. In some embodiments, a digital signal representing the desired DC voltage may be received at input Cin. In some embodiments, input Cin is configured to additionally or alternatively receive other control information, such as frequency information. In some embodiments, alternate feedback schemes are used. For example, in some embodiments, the DC voltage at output terminal Vout is fed back to PWM controller 110, and no resistor divider network is used.

Switch stack 120 includes multiple types of MOSFETs. Switch stack 120 includes fast and power efficient switches having structures consistent with MOSFETs located in internal portions of an integrated circuit, and can be referred to as core transistors. In addition, switch stack 120 includes high voltage tolerance switches which can have structures consistent with MOSFETs located in peripheral portions of the integrated circuit, and are called I/O transistors.

Core transistors typically have thinner gate oxide than the I/O transistors. For example, in some manufacturing processes, the gate oxide thickness of a core transistor may be about 1.2 nm, and the gate oxide thickness of the I/O transistors may be about 4.1 nm. Core transistors and I/O transistors may have other gate oxide thicknesses as well. In some embodiments, the gate oxide thickness of I/O transistors may be about 1.5, about 2, about 2.5, about 3, about 3.5, about 4, or more times the gate oxide thickness of core transistors.

In addition, core transistors typically have shorter minimum gate lengths and correspondingly low RD Son as compared with the I/O transistors. For example, in some manufacturing processes, the minimum gate length for core transistors may be about 28 nm, and the minimum gate length for I/O transistors may be about 150 nm.

Furthermore, core transistors typically have lower gate to source, gate to drain, and drain to source breakdown voltages than I/O transistors.

Other differences between core transistors and I/O transistors may exist, as understood by one of skill in the art.

In the embodiment of FIG. 2, switch stack 120 includes P-type MOSFETs 121, 122, and 123, and includes N-type MOSFETs 126, 127, and 128.

In some embodiments, MOSFETs 121, 122, 126, and 127 are core transistors, and MOSFETs 123 and 128 are I/O transistors. However, all combinations of core and I/O transistors are contemplated. For example, in some embodiments, MOSFETs 122, 123, 127, and 128 are I/O transistors, and MOSFETs 121 and 126 are core transistors. In alternative embodiments, MOSFETs 121, 122, 123, 126, 127, and 128, are all either core transistors or I/O transistors.

In alternative embodiments, the MOSFETs 121, 122, and 123 and 126, 127, and 128 are serially connected in a different order. For example, MOSFET 121 may be connected to MOSFET 126 with no other transistors intervening, where the gate of MOSFET 121 is connected with node 111 and the gate of MOSFET 126 is connected with node 116. In such embodiments, the bias voltages for MOSFETs 122, 123, 126, and 127 are correspondingly modified as compared with those generated in the embodiments discussed below.

In embodiments where MOSFETs 121 and 126 are core transistors, MOSFETs 121 and 126 switch very fast and have low RDSon.

In embodiments where MOSFETs 123 and 128 are I/O transistors, MOSFETs 123 and 128 increase the breakdown voltage of switch stack 120, and do not need to be actively switched on and off each cycle. Because they are not switched, the impact of their high gate charge is reduced.

In embodiments where MOSFETs 122 and 127 are either core transistors or I/O transistors, MOSFETs 122 and 127 increase the breakdown voltage of switch stack 120, and may not be actively switched on and off each cycle. When not switched, the impact of their gate charge, whether relatively high or low, is reduced.

In the embodiment of FIG. 2, MOSFETs 122, 123, 127, and 128 receive bias voltages at their gates respectively connected to one of the bias voltage inputs V1, V2, and V3, and are not switched. In some embodiments, a fourth bias voltage input is used, and each of MOSFETs 122, 123, 127, and 128 receive a different bias voltage. In some embodiments, only two bias voltage inputs are used, bias voltage inputs V1 and V3. In such embodiments, the gate of MOSFET 123 may be connected to bias voltage input V1, and the gate of MOSFET 128 may be connected to bias voltage input V3.

In alternative embodiments, MOSFETs 122, 123, 127, and 128 may be switched between their bias voltages and either the voltage at input terminal Vin or ground.

Figure 3:
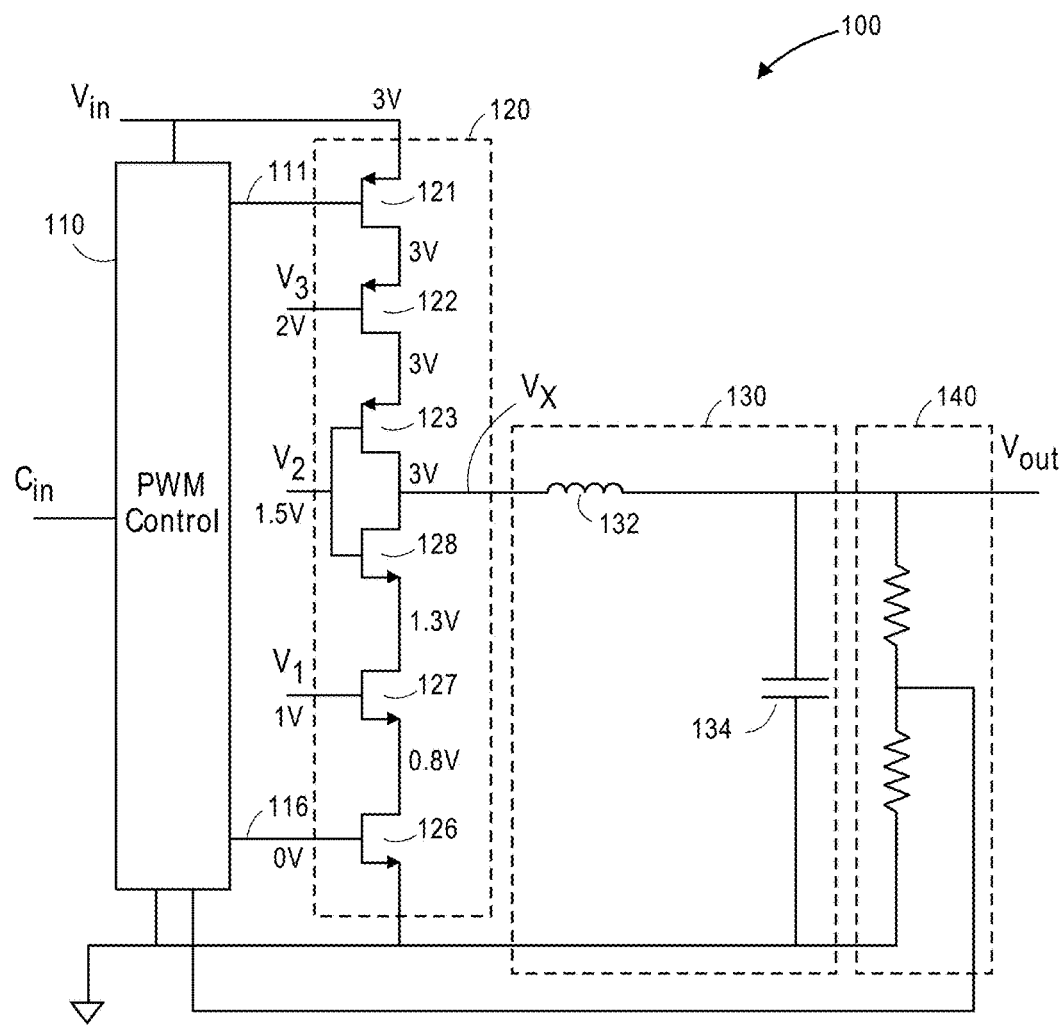
FIG. 3 is a schematic illustration of the buck converter of FIG. 2 generating a high output voltage.

FIG. 3 is a schematic illustration of buck converter 100 while the output of switch stack 120 is substantially equal to the voltage at Vin. Example voltages are indicated at the various nodes of switch stack 120. In other embodiments, different voltages occur.

As shown in this example, the voltage at input terminal Vin is equal to 3 V, and the bias voltages at bias voltage inputs V1, V2, and V3 are respectively 1 V, 1.5 V, and 2 V. In addition, the PWM signals applied to MOSFETs 121 and 126 are respectively 2 V and 0 V.

In response to their gate voltages, MOSFET 126 is substantially nonconductive, and MOSFETs 121, 122, and 123 are conductive. Consequently, the voltage at the output of switch stack 120 is 3 V. In this state, a traditional stack could see voltage overstress if low BVDSS devices are used so the N-type MOSFETs 126, 127, and 128 are at risk of experiencing damaging over voltages. However, because of their bias voltages, they do not. As shown, MOSFET 126 experiences 0.8 V, MOSFET 127 experiences 0.5 V, and MOSFET 128 experiences 1.7 V. The exact voltages are dependent on characteristics such as the threshold voltage of each device.

Figure 4:
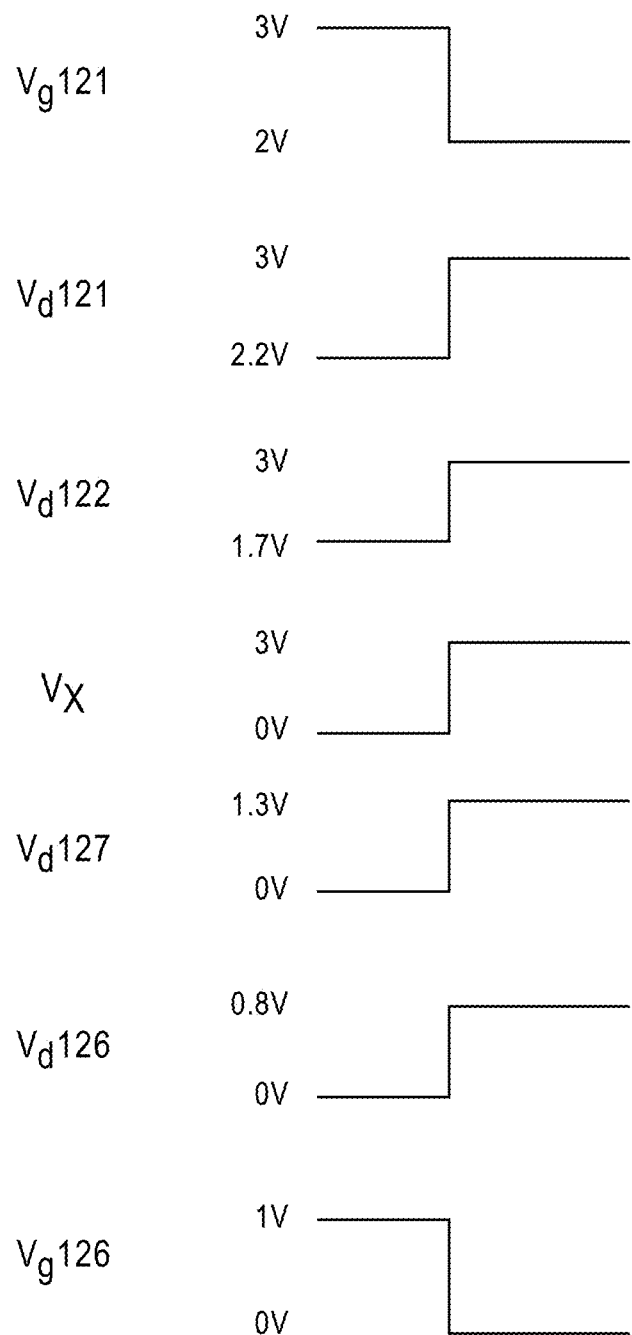
FIG. 4 is a waveform diagram illustrating a buck converter output transition from low to high.

FIG. 4 is a waveform diagram illustrating a transition from 0 V to 3 V at the output Vx of switch stack 120 response to PWM signals applied to the gates of MOSFETs 121 and 126.

As shown, the PWM signal Vg121 applied to node 111 connected to the gate of MOSFET 121 transitions from 3 V to 2 V. Likewise, substantially simultaneously, the PWM signal Vg126 applied to node 116 connected to the gate of MOSFET 126 transitions from 1 V to 0 V. In response to the gate of MOSFET 121 transitioning from 3V to 2 V, MOSFET 121 turns on. Likewise, in response to the gate of MOSFET 126 transitioning from 1V to 0 V, MOSFET 126 turns off. Although not illustrated in FIG. 4, the PWM signals Vg121 and Vg126, respectively applied to nodes 111 and 116, are aligned in time so that MOSFET 126 turns off before MOSFET 121 turns on.

In response to MOSFET 121 turning on and MOSFET 126 turning off, the following transitions occur: the voltage at the drain of MOSFET 121 Vd121 transitions from 2.2 V to 3 V, the voltage at the drain of MOSFET 122 Vd122 transitions from 1.7 V to 3 V, the voltage at the drain of MOSFET 126 Vd126 transitions from 0 V to 0.8 V, the voltage at the drain of MOSFET 127 Vd127 transitions from 0 V to 1.3 V and the voltage at the output terminal Vx of switch stack 120 transitions from 0 V to 3 V.

During the output transitions from 0 V to 3 V, MOSFETs 126, 127, and 128 may temporarily experience voltages higher than those indicated in FIG. 4. However, at least because of parasitic capacitances between each of the source nodes of transistors 127 and 128 and the nodes of switch stack 120 transitioning to 3 V, and because of sub-threshold conduction of transistors 127 and 128, the duration and magnitude of the voltages higher than those indicated in FIG. 3 experience by MOSFETs 126, 127, and 128 are less than that which would be required to damage MOSFETs 126, 127, and 128. In some embodiments, switch stack 120 is physically formed with capacitive structures which increase the capacitance between each of the source nodes of transistors 127 and 128 and the nodes of switch stack 120 transitioning to 3 V.

Figure 5:
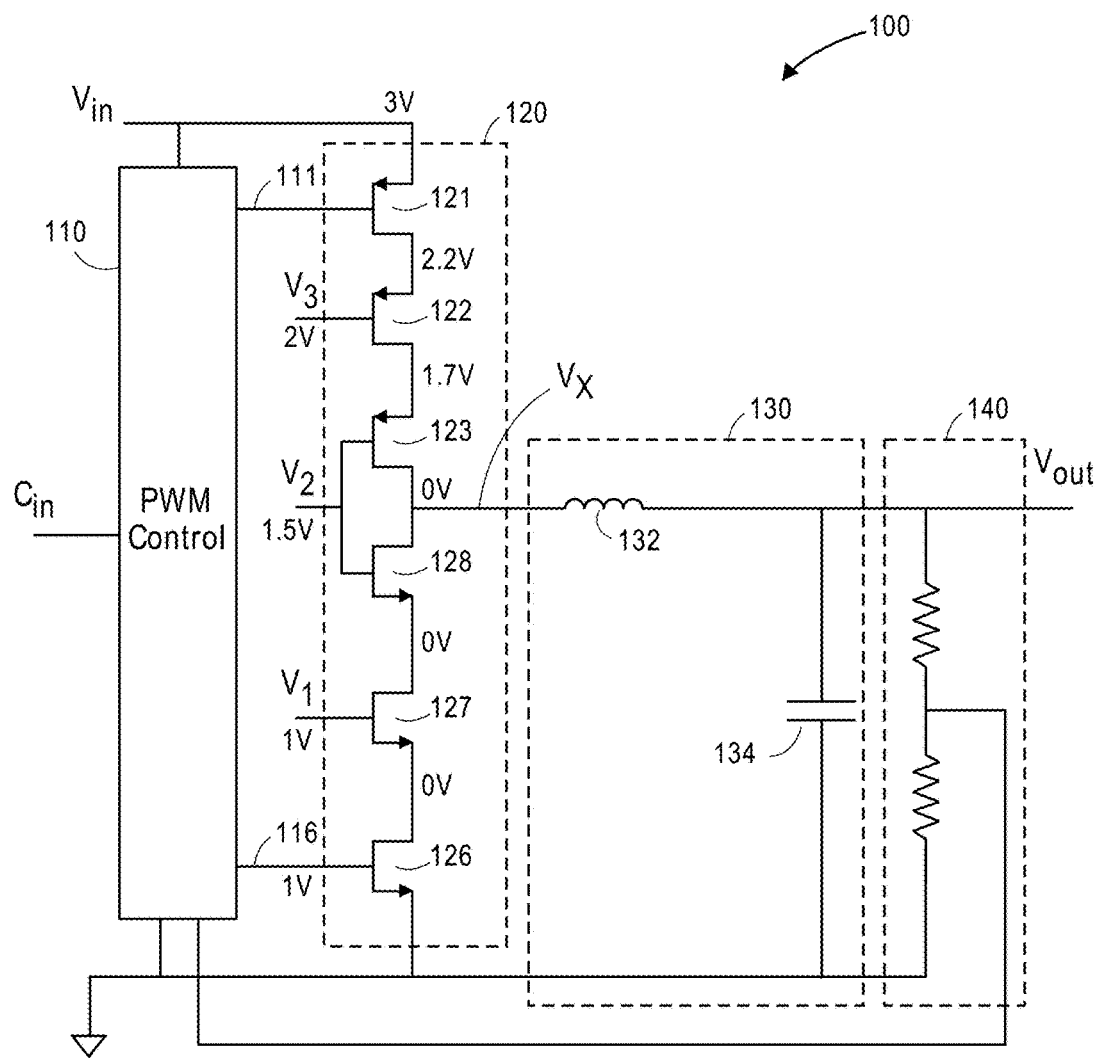
FIG. 5 is a schematic illustration of the buck converter of FIG. 2 generating a low output voltage.

FIG. 5 is a schematic illustration of buck converter 100 while the output of switch stack 120 is substantially equal to ground. Example voltages are indicated at the various nodes of switch stack 120. In other embodiments, different voltages occur.

As shown in this example, the voltage at input terminal Vin is equal to 3 V, and the bias voltages at bias voltage inputs V1, V2, and V3 are respectively 1 V, 1.5 V, and 2 V. In addition, the PWM signals applied to MOSFETs 121 and 126 are respectively 3 V and 1 V.

In response to their gate voltages, MOSFET 121 is substantially nonconductive, and MOSFETs 126, 127, and 128 are conductive. Consequently, the voltage at the output of switch stack 120 is 0 V. In this state, the P-type MOSFETs 121, 122, and 123 are at risk of experiencing damaging over voltages. However, because of their bias voltages, they do not. As shown, MOSFET 121 experiences 0.8 V, MOSFET 122 experiences 0.5 V, and MOSFET 123 experiences 1.7 V.

Figure 6:
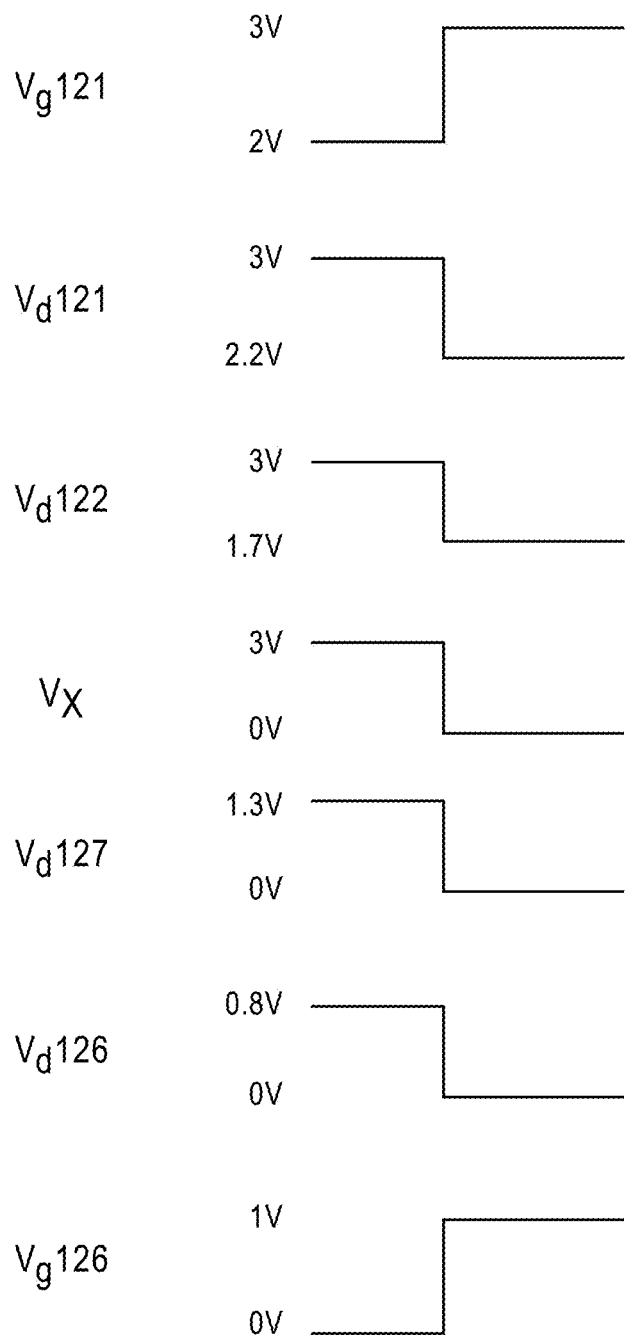
FIG. 6 is a waveform diagram illustrating a buck converter output transition from high to low.

FIG. 6 is a waveform diagram illustrating a transition from 3 V to 0 V at the output Vx of switch stack 120 response to PWM signals applied to the gates of MOSFETs 121 and 126.

As shown, the PWM signal Vg121 applied to node 111 connected to the gate of MOSFET 121 transitions from 2 V to 3 V. Likewise, substantially simultaneously, the PWM signal Vg126 applied to node 116 connected to the gate of MOSFET 126 transitions from 0 V to 1 V. In response to the gate of MOSFET 121 transitioning from 2 V to 3 V, MOSFET 121 turns off. Likewise, in response to the gate of MOSFET 126 transitioning from 0 V to 1 V, MOSFET 126 turns on. Although not illustrated in FIG. 6, the PWM signals Vg121 and Vg126, respectively applied to nodes 111 and 116, are aligned in time so that MOSFET 126 turns on after MOSFET 121 turns off.

In response to MOSFET 121 turning on and MOSFET 126 turning off, the following transitions occur: the voltage at the drain of MOSFET 121 Vd121 transitions from 3 V to 2.2 V, the voltage at the drain of MOSFET 122 Vd122 transitions from 3 V to 1.7 V, the voltage at the drain of MOSFET 126 Vd126 transitions from 0.8 V to 0 V, the voltage at the drain of MOSFET 127 Vd127 transitions from 1.3 V to 0 V and the voltage at the output terminal Vx of switch stack 120 transitions from 3 V to 0 V.

During output transitions from 3 V to 0 V, MOSFETs 126, 127, and 128 may temporarily experience voltages higher than those indicated in FIG. 6. However, at least because of parasitic capacitances between each of the source nodes of transistors 127 and 128 and the nodes of switch stack 120 transitioning to 0 V, and because of sub-threshold conduction of transistors 127 and 128, the duration and magnitude of the voltages higher than those indicated in FIG. 6 experience by MOSFETs 126, 127, and 128 are less than that which would be required to damage MOSFETs 126, 127, and 128. In some embodiments, switch stack 120 is physically formed with capacitive structures which increase the capacitance between each of the source nodes of transistors 127 and 128 and the nodes of switch stack 120 transitioning to 0 V.

As shown in FIGS. 4 and 6, PWM controller 110 switches the gate of MOSFET 121 between 2 V and 3 V. Furthermore, as shown in FIGS. 3 and 5, 3 V is the voltage at Vin, and 2 V is the voltage at the bias voltage input V3.

Figure 1:
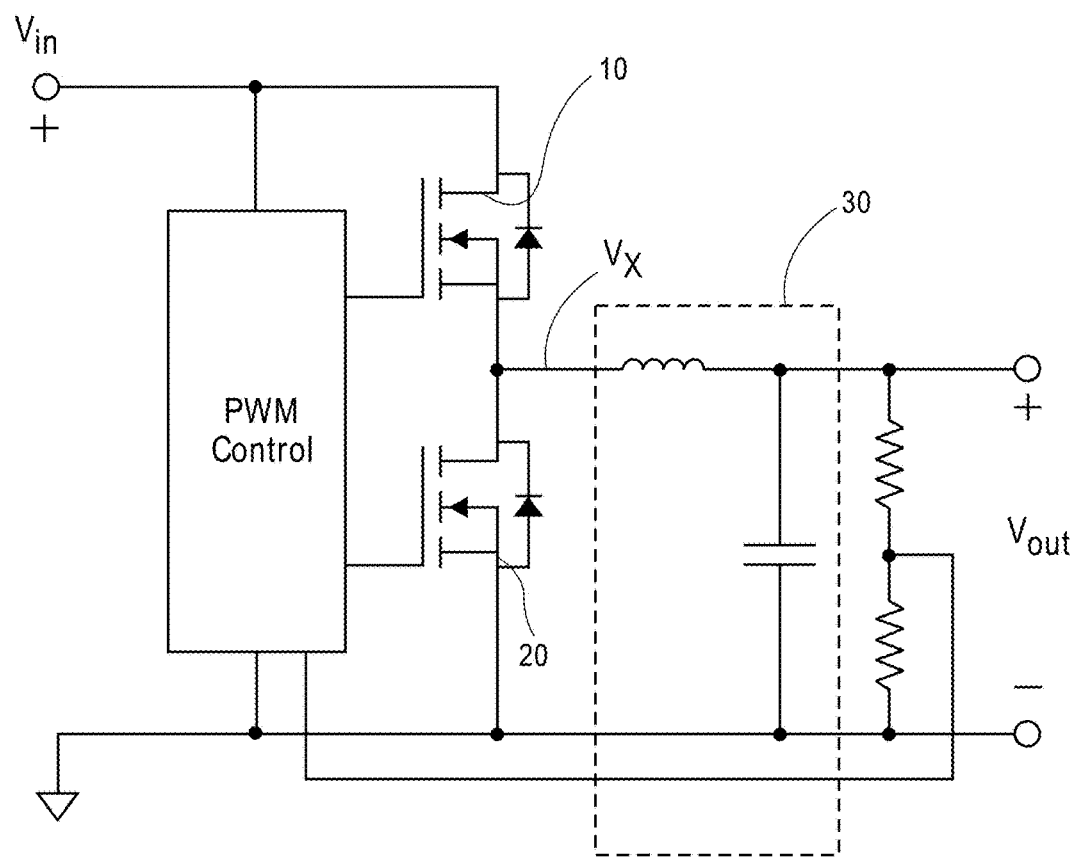
FIG. 1 is a schematic illustration of a conventional buck power converter.

Similarly, as shown in FIGS. 4 and 6, PWM controller 110 switches the gate of MOSFET 126 between 0 V and 1 V, and, as shown in FIGS. 3 and 5, 1 V is the voltage at the bias voltage input V1 and 0 V is the ground voltage.

Figure 7:
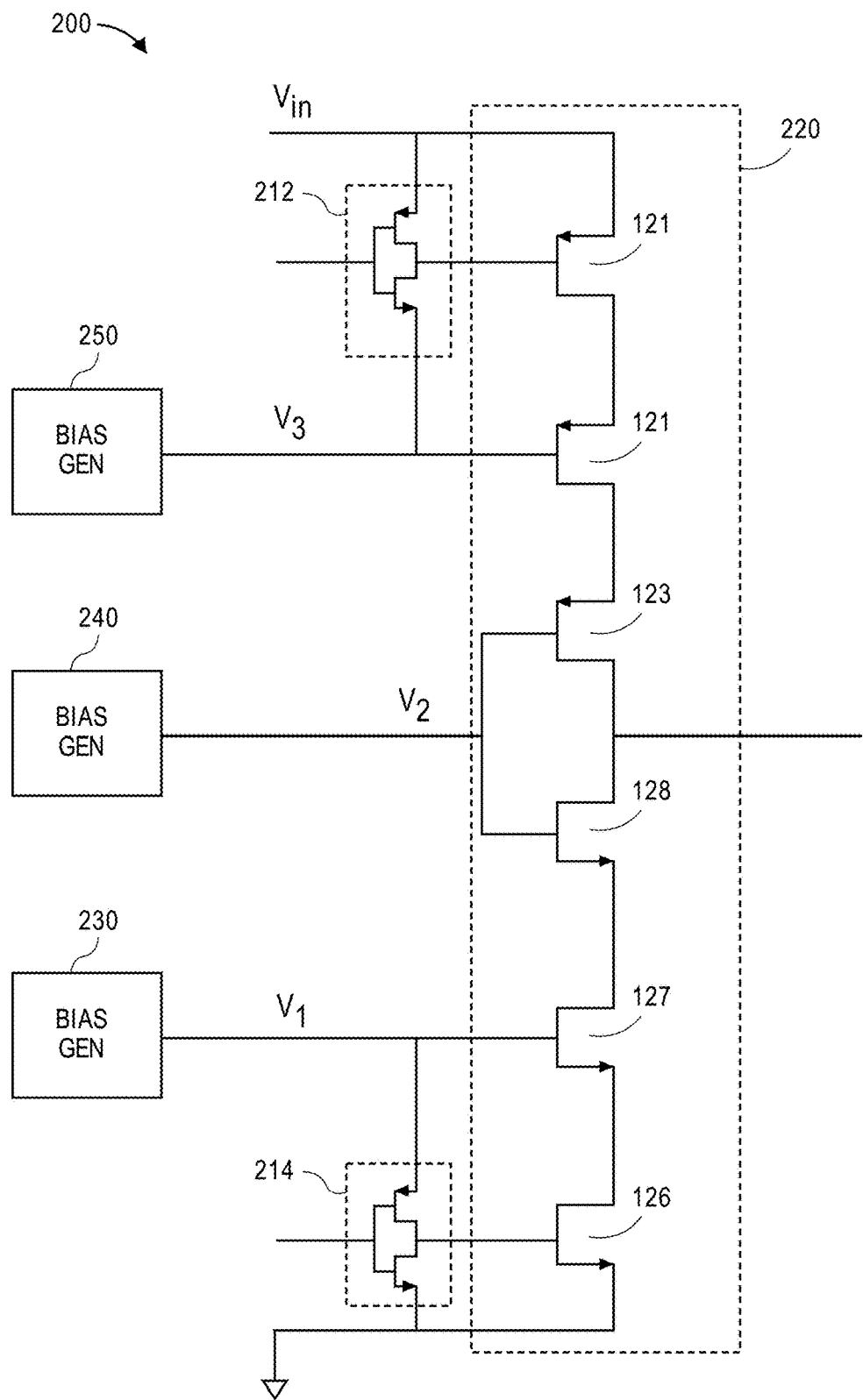
FIG. 7 is a schematic illustration of a portion of a buck converter connected to bias voltage generators.

FIG. 7 is a schematic illustration of a portion 200 of a buck converter connected to bias voltage generators 230, 240, and 250. Portion 200 includes inverter 212, inverter 214, and switch stack 220. In some embodiments, inverters 212 and 214 may be part of a PWM controller circuit, such as PWM controller 110 of FIG. 2.

As shown, the power and ground connections for inverter 212 are respectively connected to the input terminal Vin and bias voltage input V3. As a result, in response to a PWM signal driving inverter 212, inverter 212 causes the gate voltage of transistor 121 to be either the voltage at input terminal Vin or the voltage at bias voltage input V3.

In addition, the power and ground connections for inverter 214 are respectively connected to bias voltage input V1 and ground. As a result, in response to a PWM signal driving inverter 214, inverter 214 causes the gate voltage of transistor 126 to be either the voltage at the voltage at bias voltage input V1 or ground.

Bias voltage generators 230, 240, and 250 are configured to respectively generate the bias voltages at V1, V2, and V3. Bias voltage generators 230, 240, and 250 may have bias voltage generation architectures as known to those of ordinary skill in the art configured to generate fixed bias voltages.

Figure 8:
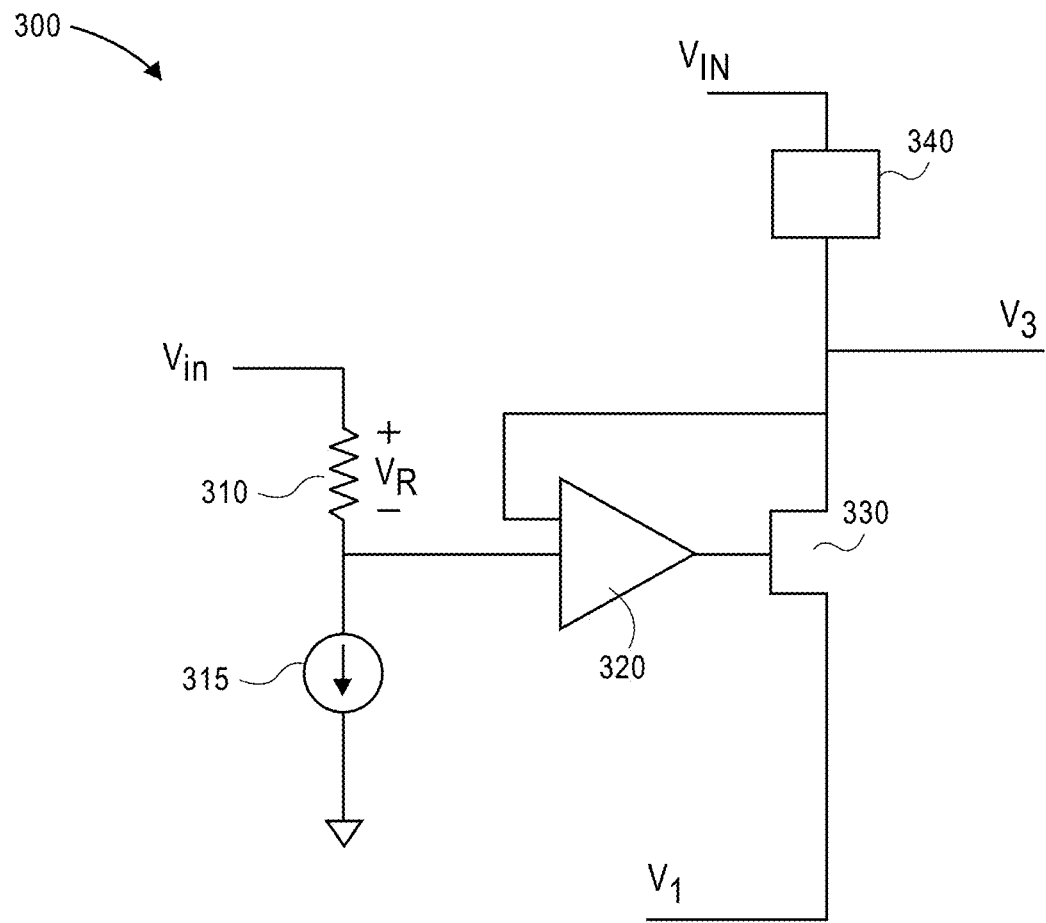
FIG. 8 is a schematic illustration of a bias voltage generator which may be used as a bias generator of the buck converter of FIG. 7.

FIG. 8 is a schematic illustration of a bias voltage generator 300 which may be used, for example as bias generator 250 to generate the bias voltage at V3 in FIG. 7.

Bias voltage generator 300 includes resistor 310, current source 315, amplifier 320, transistor 330, and pull up device 340.

Resistor 310 and current source 315 collectively generate a reference voltage substantially equal to the bias voltage to be applied to V3. The reference voltage is referenced to Vin, and is a fixed voltage drop VR from the voltage at Vin. The magnitude of the fixed voltage drop VR is determined by the IR drop in resistor 310. In some embodiments, the fixed voltage drop VR is substantially equal to the voltage at V1, such that the reference voltage is substantially equal to the voltage at input terminal Vin minus the voltage at V1.

The reference voltage is applied to amplifier 320, which in cooperation with transistor 330 and pull up device 340 generates the bias voltage applied to V3.

In some embodiments, transistor 330 is a P-type transistor, for example, in a source-follower configuration. In some embodiments, transistor 330 is an N-type transistor, for example, in a common-source configuration. In some embodiments, alternative configurations may be used.

Pull up device 340 may comprise one or more of a resistor, a diode-connected transistor, a current source, and a capacitor.

As shown, transistor 330 is connected to V1, which has a voltage generated by bias voltage generator 230, as shown in FIG. 7. Therefore, the charge flowing through inverter 212 of FIG. 7 from input terminal Vin to V3 also flows through transistor 330 to V1. Consequently, because the charge is conducted to V1, it can be reused by another circuit powered by the voltage at V1, such as inverter 214.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A switching voltage converter, comprising:
   a controller configured to generate one or more control signals; and
   a plurality of serially connected switches configured to receive the one or more control signals and to generate an output voltage signal at an output terminal based on the received one or more control signals, wherein the output voltage signal is controlled to be substantially equal to a first voltage or substantially equal to a second voltage dependent on the one or more control signals,
   wherein a first switch of the plurality of serially connected switches has a first breakdown voltage and a second switch of the plurality of serially connected switches has a second breakdown voltage, and wherein the first breakdown voltage is less than the second breakdown voltage,
   wherein the first switch is configured to receive a first of the one or more control signals and to be selectively turned on according to the first control signal,
   wherein the first switch is configured to receive an input voltage from an input voltage terminal and to provide current from the input voltage terminal to the output terminal through a second switch, wherein a third switch of the plurality of serially connected switches is connected between the first and second switches, wherein the third switch has a third breakdown voltage, and wherein the third breakdown voltage is substantially equal to the first breakdown voltage, wherein the first, second, and third switches are all P-type or are all N-type switches, and wherein the first switch is further configured to provide current from the input voltage terminal to the output terminal through the third switch.

2. The switching voltage converter of claim 1, wherein a fourth switch of the plurality of serially connected switches has a fourth breakdown voltage and a fifth switch of the plurality of serially connected switches has a fifth breakdown voltage, wherein the fourth switch is configured to receive a second of the one or more control signals, wherein the fourth breakdown voltage is less than the fifth breakdown voltage, wherein a sixth switch of the plurality of serially connected switches is connected between the fourth and fifth switches, wherein the sixth switch has a sixth breakdown voltage, wherein the sixth breakdown voltage is substantially equal to the fourth breakdown voltage, and wherein the fourth switch is configured to source current to the output terminal through the fifth and sixth switches.

3. The switching voltage converter of claim 2, further comprising a semiconductor substrate, wherein the controller and the first, second, and third switches are integrated on the semiconductor substrate.

4. The switching voltage converter of claim 3, further comprising a filter configured to receive the output voltage signal from the switches and to generate an output voltage, wherein the output voltage is substantially DC and has a value substantially equal to the average voltage of the output voltage signal, and wherein the filter is integrated on the semiconductor substrate with the controller and the switches.

5. The switching voltage converter of claim 2, wherein the second switch is configured to receive a first bias voltage, the third switch is configured to receive a second bias voltage, the fifth switch is configured to receive a third bias voltage, and the sixth switch is configured to receive a fourth bias voltage, and wherein the first and third bias voltages are substantially equal.

6. The switching voltage converter of claim 5, wherein the first control signal is configured to switch between the voltage of the input voltage and the voltage of the second bias voltage, and wherein the second control signal is configured to switch between the voltage of the fourth bias voltage and a ground voltage.

7. The switching voltage converter of claim 2, wherein the second switch is configured to receive a first bias voltage, the third switch is configured to receive a second bias voltage, the fifth switch is configured to receive a third bias voltage, and the sixth switch is configured to receive a fourth bias voltage, and wherein the first and fourth bias voltages are substantially equal and the second and third bias voltages are substantially equal.

8. The switching voltage converter of claim 2, further comprising first and second inverters configured to respectively generate the first and second control signals, wherein the second switch is configured to receive a first bias voltage, the third switch is configured to receive a second bias voltage, the fifth switch is configured to receive a third bias voltage, and the sixth switch is configured to receive a fourth bias voltage, and wherein the first inverter has a ground connection connected to the second bias voltage and the second inverter has a power connection connected to the fourth bias voltage.

9. The switching voltage converter of claim 8, further comprising a bias voltage generator configured to generate the third bias voltage, wherein the bias voltage generator comprises a current path between a ground connection of the first inverter and the power connection of the second inverter.

10. The switching voltage converter of claim 8, further comprising a bias voltage generator configured to generate the third bias voltage, wherein third bias voltage is substantially equal to the input voltage minus the fourth bias voltage.

11. A switching voltage converter, comprising:
a plurality of serially connected switches configured to generate an output voltage signal at an output terminal, wherein the output voltage signal has an average voltage determined at least partly by one or more control signals, wherein a first switch of the plurality of serially connected switches has a first breakdown voltage and a second switch of the plurality of serially connected switches has a second breakdown voltage, wherein the first breakdown voltage is less than the second breakdown voltage, and wherein the first and second switches are both P-type or are both N-type switches, wherein the first switch is configured to receive a first of the one or more pulse control signals and to be selectively turned on according to the first control signal, wherein the first switch is configured to receive an input voltage from an input voltage terminal and to provide current from the input voltage terminal to the output terminal through the second switch, wherein a third switch of the plurality of serially connected switches is connected between the first and second switches, wherein the third switch has a third breakdown voltage, wherein the third breakdown voltage is substantially equal to the second breakdown voltage, wherein the first switch is further configured to provide current from the input voltage terminal to the output terminal through the third switch, wherein a fourth switch of the plurality of serially connected switches has a fourth breakdown voltage and a fifth switch of the plurality of serially connected switches has a fifth breakdown voltage, wherein the fourth switch is configured to receive a second of the one or more pulse control signals, wherein the fourth breakdown voltage is less than the fifth breakdown voltage, wherein a sixth switch of the plurality of serially connected switches is connected between the fourth and fifth switches, wherein the sixth switch has a sixth breakdown voltage, wherein the sixth breakdown voltage is substantially equal to the fourth breakdown voltage, and wherein the fourth switch is configured to sink current from the output terminal through the fifth and sixth switches.

12. The switching voltage converter of claim 11, further comprising a semiconductor substrate, wherein the first, second, third, fourth, fifth, and sixth switches are integrated on the semiconductor substrate.

13. The switching voltage converter of claim 12, further comprising a filter configured to receive the output voltage signal from the first, second, third, fourth, fifth, and sixth switches and to generate an output voltage, wherein the output voltage is substantially DC and has a value substantially equal to the average voltage of the output voltage signal, and wherein the filter is integrated on the semiconductor substrate with the first, second, third, fourth, fifth, and sixth switches.

14. The switching voltage converter of claim 11, wherein the second switch is configured to receive a first bias voltage, the third switch is configured to receive a second bias voltage, the fifth switch is configured to receive a third bias voltage, and the sixth switch is configured to receive a fourth bias voltage, and wherein the first and third bias voltages are substantially equal.

15. The switching voltage converter of claim 14, wherein the first control signal is configured to switch between the voltage of the input voltage and the voltage of the second bias voltage, and wherein the second control signal is configured to switch between the voltage of the fourth bias voltage and a ground voltage.

16. The switching voltage converter of claim 11, wherein the second switch is configured to receive a first bias voltage, the third switch is configured to receive a second bias voltage, the fifth switch is configured to receive a third bias voltage, and the sixth switch is configured to receive a fourth bias voltage, and wherein the first and fourth bias voltages are substantially equal and the second and third bias voltages are substantially equal.

17. The switching voltage converter of claim 11, further comprising first and second inverters configured to respectively generate the first and second pulse control signals, wherein the second switch is configured to receive a first bias voltage, the third switch is configured to receive a second bias voltage, the fifth switch is configured to receive a third bias voltage, and the sixth switch is configured to receive a fourth bias voltage, and wherein the first inverter has a ground connection connected to the second bias voltage and the second inverter has a power connection connected to the fourth bias voltage.

18. The switching voltage converter of claim 17, further comprising a bias voltage generator configured to generate the third bias voltage, wherein the bias voltage generator comprises a current path between a ground connection of the first inverter and the power connection of the second inverter.

19. The switching voltage converter of claim 17, further comprising a bias voltage generator configured to generate the third bias voltage, wherein third bias voltage is substantially equal to the input voltage minus the fourth bias voltage.

* * * * *